(12) United States Patent
Jang et al.

(10) Patent No.: US 12,159,861 B2
(45) Date of Patent: Dec. 3, 2024

(54) LIGHT EMITTING DIODE AND DISPLAY APPARATUS HAVING THE SAME

(71) Applicant: SEOUL VIOSYS CO., LTD., Ansan-si (KR)

(72) Inventors: Seong Kyu Jang, Ansan-si (KR); Yong Woo Ryu, Ansan-si (KR); Seom Geun Lee, Ansan-si (KR); Cha E Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 460 days.

(21) Appl. No.: 17/722,369

(22) Filed: Apr. 17, 2022

(65) Prior Publication Data

US 2022/0336428 A1     Oct. 20, 2022

Related U.S. Application Data

(60) Provisional application No. 63/325,110, filed on Mar. 29, 2022, provisional application No. 63/176,598, filed on Apr. 19, 2021.

(51) Int. Cl.
*H01L 25/075*     (2006.01)
*H01L 25/16*       (2023.01)
(Continued)

(52) U.S. Cl.
CPC ........ *H01L 25/0756* (2013.01); *H01L 25/167* (2013.01); *H01L 33/0093* (2020.05); *H01L 33/382* (2013.01); *H01L 33/46* (2013.01); H01L 24/05 (2013.01); H01L 24/06 (2013.01); H01L 24/08 (2013.01); H01L 24/29 (2013.01); H01L 24/32 (2013.01); H01L 24/33 (2013.01); H01L 24/80 (2013.01); H01L 24/83 (2013.01); H01L 24/95 (2013.01); H01L 33/007 (2013.01); H01L 33/32 (2013.01); H01L 2224/05009 (2013.01); H01L 2224/05082 (2013.01);
(Continued)

(58) Field of Classification Search
CPC .................. H01L 25/0756; H01L 33/382
See application file for complete search history.

(56) References Cited

U.S. PATENT DOCUMENTS 10,084,020 B2    9/2018    Kang et al.
11,289,461 B2    3/2022    Kim et al.
(Continued)

FOREIGN PATENT DOCUMENTS

KR     102049384       1/2015
KR     20180060704     6/2018
(Continued)

OTHER PUBLICATIONS

International Search Report dated Aug. 11, 2022 in International Application No. PCT/KR2022/005542.

*Primary Examiner* — Daniel P Shook
(74) *Attorney, Agent, or Firm* — Oblon, McClelland, Maier & Neustadt, L.L.P.

(57) ABSTRACT

A light emitting device including a first LED stack, a second LED stack disposed on the first LED stack, a third LED stack disposed on the second LED stack, and a common electrode electrically connected to a first conductivity type semiconductor layer of each of the first, second, and third LED stacks, in which the common electrode includes a step in at least one of the first, second and third LED stacks.

20 Claims, 8 Drawing Sheets

(51) Int. Cl.
  *H01L 33/00* (2010.01)
  *H01L 33/38* (2010.01)
  *H01L 33/46* (2010.01)
  *H01L 23/00* (2006.01)
  *H01L 33/32* (2010.01)
(52) U.S. Cl.
  CPC ............ *H01L 2224/05111* (2013.01); *H01L 2224/0512* (2013.01); *H01L 2224/05139* (2013.01); *H01L 2224/05147* (2013.01); *H01L 2224/05155* (2013.01); *H01L 2224/05157* (2013.01); *H01L 2224/05166* (2013.01); *H01L 2224/0518* (2013.01); *H01L 2224/05554* (2013.01); *H01L 2224/05562* (2013.01); *H01L 2224/05573* (2013.01); *H01L 2224/0613* (2013.01); *H01L 2224/08145* (2013.01); *H01L 2224/08155* (2013.01); *H01L 2224/29017* (2013.01); *H01L 2224/29188* (2013.01); *H01L 2224/2919* (2013.01); *H01L 2224/32145* (2013.01); *H01L 2224/33181* (2013.01); *H01L 2224/80201* (2013.01); *H01L 2224/83201* (2013.01); *H01L 2224/83931* (2013.01); *H01L 2224/951* (2013.01); *H01L 2924/013* (2013.01)

(56) References Cited

U.S. PATENT DOCUMENTS

| | | | |
|---|---|---|---|
| 2009/0078955 | A1 | 3/2009 | Fan et al. |
| 2019/0165037 | A1* | 5/2019 | Chae ................ H01L 27/156 |
| 2019/0189596 | A1 | 6/2019 | Chae et al. |
| 2019/0214373 | A1* | 7/2019 | Kim .................... H01L 33/22 |

FOREIGN PATENT DOCUMENTS

| | | |
|---|---|---|
| KR | 20200085788 | 7/2020 |
| KR | 20200090841 | 7/2020 |

* cited by examiner

LIGHT EMITTING DIODE AND DISPLAY APPARATUS HAVING THE SAME

CROSS REFERENCE TO RELATED APPLICATIONS

This application claims the benefit of U.S. Provisional Patent Application No. 63/176,598, filed on Apr. 19, 2021, and U.S. Provisional Patent Application No. 63/325,110, filed on Mar. 29, 2022, each of which is hereby incorporated by reference for all purposes as if fully set forth herein.

BACKGROUND

Field

Exemplary embodiments of the invention relate generally to a light emitting device and a display apparatus having the same.

Discussion of the Background

A light emitting device is a semiconductor device employing a light emitting diode as an inorganic light source and is used in various fields, such as displays, vehicle lamps, and general lighting devices. The light emitting diode is rapidly replacing conventional light sources due to its longer lifespan, lower power consumption, and quicker response speed that conventional light sources.

A typical light emitting device has been mainly used as a light source of a backlight unit for displays. Recently, a display that directly displays images using light emitting devices has been developed. Such a display is generally referred to as a micro-LED display.

In general, a display realizes various colors by mixing blue, green, and red light. Such a display includes multiple pixels to display various images and each of the pixels includes blue, green, and red sub-pixels. The color of a specific pixel depends upon the colors of these sub-pixels, and an image is realized by combination of these pixels.

A micro-LED display has a structure in which micro-LEDs are arranged in a plane to correspond to respective sub-pixels. In general, a large number of micro-LEDs is mounted on one substrate. However, since a micro-LED has a very small size of 200 μm or less, specifically 100 μm or less, the micro-LED has a very restrictive effective luminous area. In addition, electrodes formed for electrical connection to the micro-LEDs further reduces the luminous area, thereby causing loss of luminance.

The above information disclosed in this Background section is only for understanding of the background of the inventive concepts, and, therefore, it may contain information that does not constitute prior art.

SUMMARY

Light emitting devices constructed according to exemplary embodiments of the invention are capable of mitigating a reduction in a light emitting area from elements for electrical connection, and a display apparatus having the same.

Exemplary embodiments also provide a light emitting device capable of increasing light extraction efficiency and a display apparatus having the same.

Additional features of the inventive concepts will be set forth in the description which follows, and in part will be apparent from the description, or may be learned by practice of the inventive concepts.

A light emitting device according to an exemplary embodiment includes: a first LED stack; a second LED stack disposed on the first LED stack; a third LED stack disposed on the second LED stack; and a common electrode electrically connected to a first conductivity type semiconductor layer of each of the first, second, and third LED stacks, in which the common electrode includes a step in at least one of the first, second, and third LED stacks.

The first, second, and third LED stacks may be configured to emit light of different wavelengths from one another.

The first, second, and third LED stacks may be configured to emit blue light, green light, and red light, respectively.

The first LED stack may have a larger effective luminous area than the second and third LED stacks, and the second LED stack may have a larger effective luminous area than the third LED stack.

Each of the first, second, and third LED stacks may have a texture on one surface thereof.

The light emitting device may further include a first connection electrode, a second connection electrode, and a third connection electrode in electrical contact with each second conductivity type semiconductor layer of the first, second, and third LED stacks.

Each of the first and second connection electrodes may have a width gradually decreasing in a direction from the first LED stack to the third LED stack.

The first, second, and third connection electrodes may have the same minimum width.

The common electrode may include a plurality of sub-electrodes coaxially arranged with one another.

An outer surface from the first LED stack to the third LED stack may be formed along a same line.

A light emitting device according to another exemplary embodiment includes a first LED stack, a second LED stack disposed on the first LED stack, a third LED stack disposed on the second LED stack, a common electrode electrically connected to the first conductivity type semiconductor layer of each of the first, second, and third LED stacks, and an insulation layer covering the first, second, and third LED stacks, in which the second and third LED stacks are recessed inwardly than an outer periphery of the first LED stack, and a portion of the insulation layer disposed on an upper surface of the first LED stack is exposed around the second LED stack.

The light emitting device may further include material layers disposed on each side surface and each exposed upper surface of the first, second, and third LED stacks, and at least one of the material layers may have a different thickness.

The light emitting device may further include a reflection layer disposed on each side surface of the first, second, and third LED stacks.

The insulation layer may be interposed between the side surface of each of the first, second, and third LED stacks and the reflection layer.

Each LED stack may have a width gradually decreasing from the first LED stack to the third LED stack.

The first LED stack may have a greater width than the second and third LED stacks, and the second LED stack may have a greater width than the third LED stack.

The first LED stack may have a larger effective luminous area than the second and third LED stacks, and the second LED stack may have a larger effective luminous area than the third LED stack.

The common electrode may pass through at least one of the first, second, and third LED stacks.

The common electrode may include a step in at least one of the first, second, and third LED stacks.

A minimum width of the common electrode may be one third of a maximum width thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
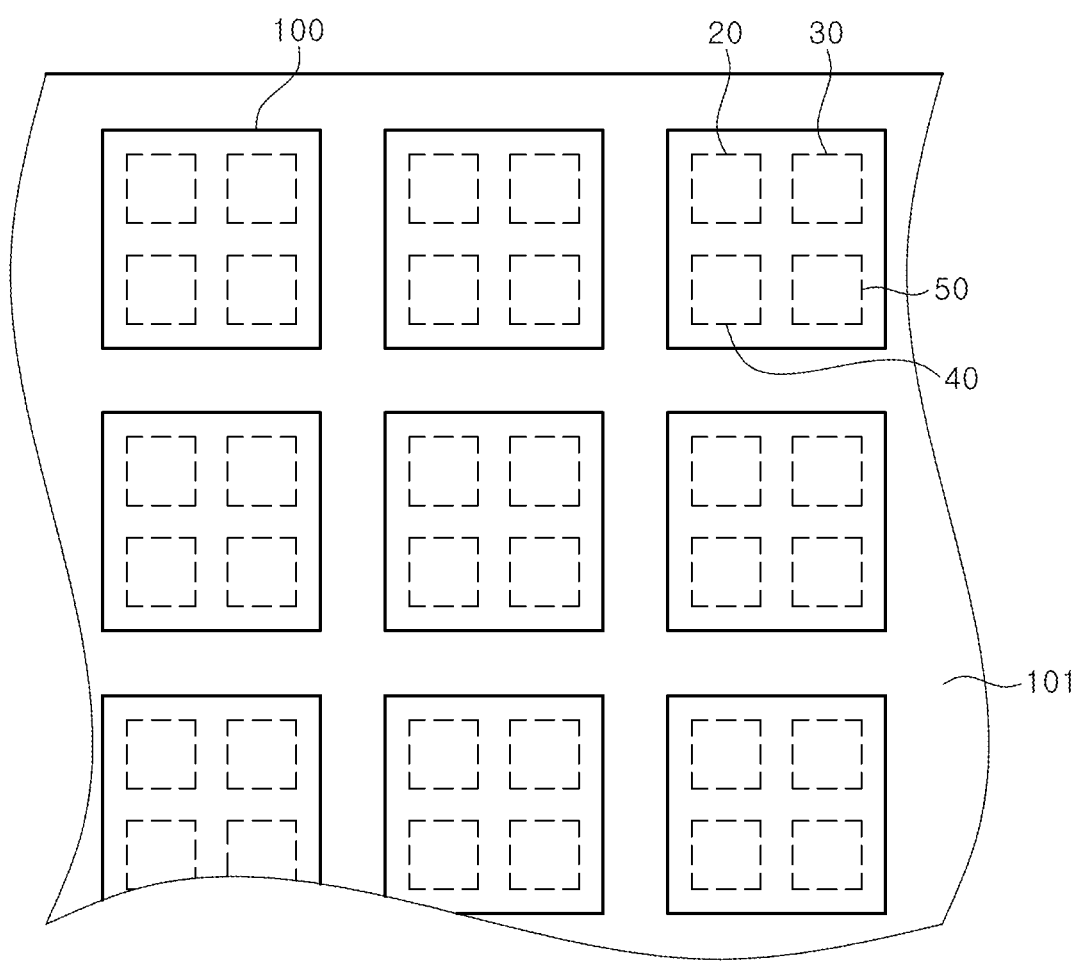
FIG. 1 is a top plan view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a top plan view of a display apparatus according to an exemplary embodiment.

Referring to FIG. 1, the display apparatus may include a panel substrate 101 and a plurality of light emitting devices 100.

The panel substrate 101 may be formed of a material, such as polyimide (PI), FR-4 glass epoxy (FR4), glass, and the like, and may include a circuit for passive matrix driving or active matrix driving. In some exemplary embodiments, the panel substrate 101 may include interconnects and resistors therein. In other exemplary embodiments, the panel substrate 101 may include interconnects, transistors, and capacitors. In addition, the panel substrate 101 may have pads disposed on an upper surface thereof and electrically connected to the circuit thereon.

The light emitting devices 100 may be arranged on the panel substrate 101. Each of the light emitting devices 100 may form a single pixel. Each of the light emitting devices 100 may include first, second, third, and fourth bump pads 20, 30, 40, and 50 electrically connected to the panel substrate 101, and the light emitting devices 100 may be spaced apart from one another.

Figure 2A:
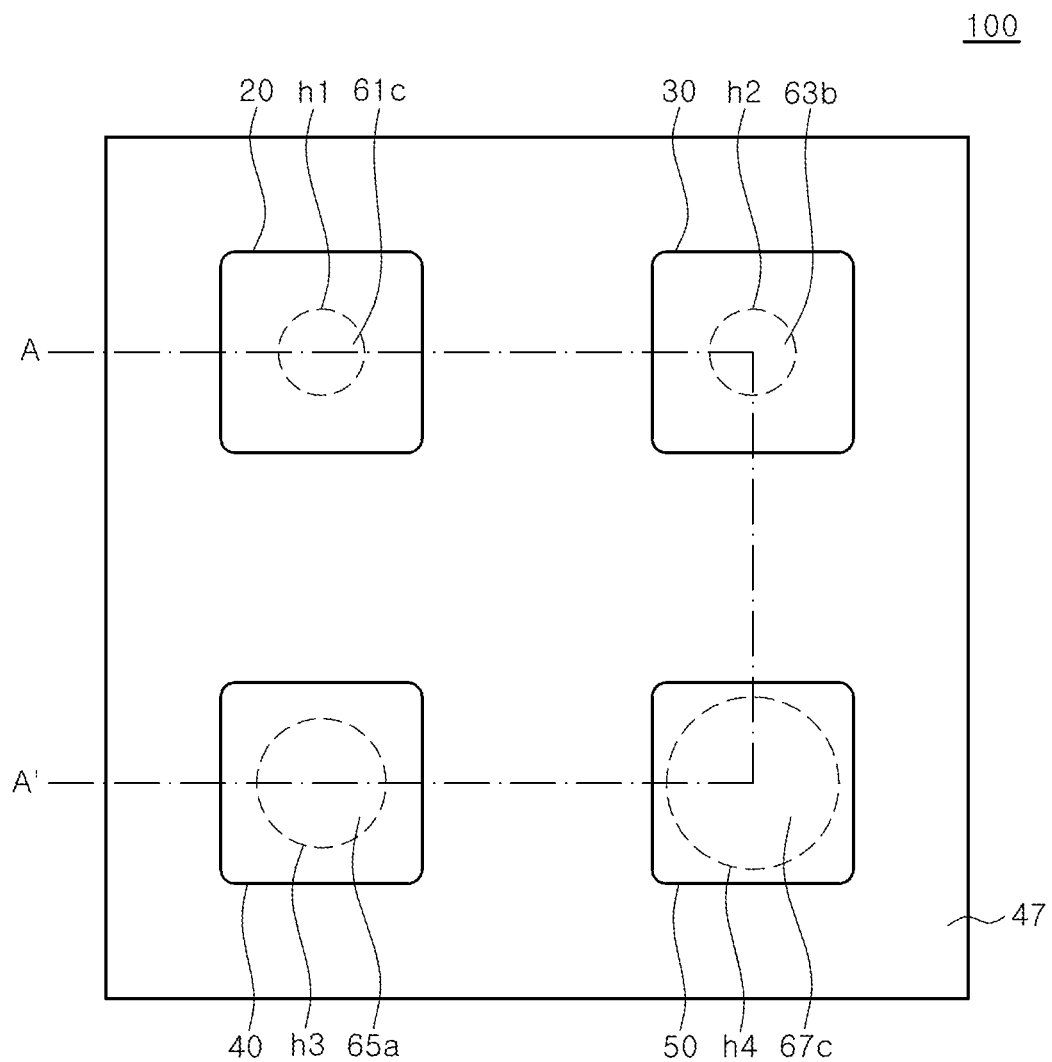
FIG. 2A is a top plan view of a light emitting device according to an exemplary embodiment.
Figure 2B:
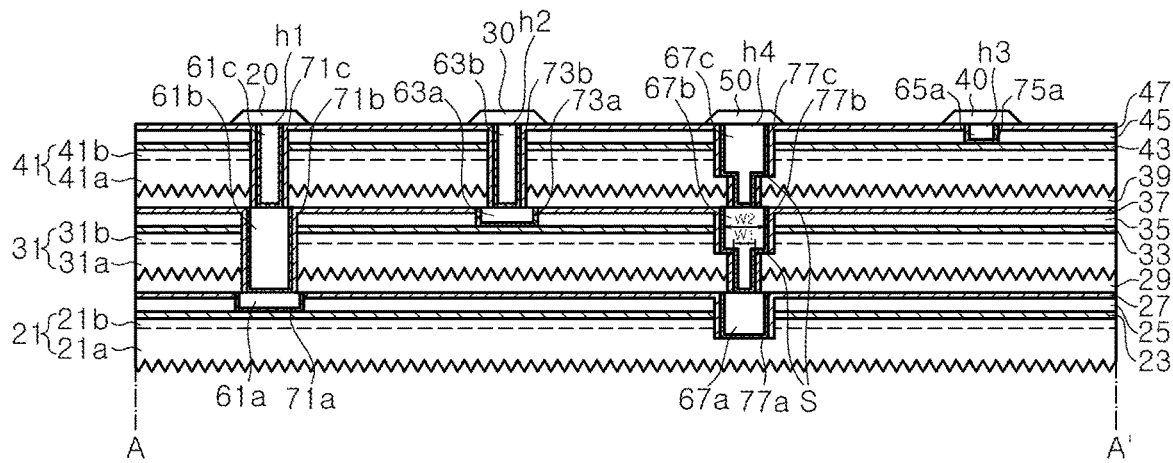
FIG. 2B is a schematic cross-sectional view taken along line A-A' of its corresponding plan view shown in FIG. 2A.

FIG. 2A is a top plan view of a light emitting device according to an exemplary embodiment, and FIG. 2B is a cross-sectional view taken along line A-A' of its corresponding plan view shown in FIG. 2A.

Referring to FIG. 2A and FIG. 2B, the light emitting device 100 may include first, second, third, and fourth bump pads 20, 30, 40, and 50, first, second, and third LED stacks 21, 31, and 41, first, second, and third transparent electrodes 23, 33, and 43, first, second, and third protection layers 25, 35, and 45, first, second, and third insulation layers 27, 37, and 47, a first bonding layer 29, a second bonding layer 39, connection electrodes 61a, 61b, 61c, 63a, 63b, and 65a, and common electrodes 67a, 67b, and 67c.

The first, second, third, and fourth bump pads 20, 30, 40, and 50 according to the illustrated exemplary embodiment may be formed on an upper surface of the light emitting device 100 and function as connection pads for supplying power to the light emitting device 100 from the outside. However, the inventive concepts are not limited to a particular location of the first, second, third, and fourth bump pads 20, 30, 40, and 50. For example, the first, second, third, and fourth bump pads 20, 30, 40, and 50 in other exemplary embodiments may be disposed on a lower surface and/or a side surface of the light emitting device 100.

The first, second, third, and fourth bump pads 20, 30, 40, and 50 may be disposed on the third LED stack 41. When the light emitting device 100 is coupled to the panel substrate 101, the light emitting device 100 may be flip bonded, such that the first, second, third, and fourth bump pads 20, 30, 40, and 50 adjoin the pads formed on the panel substrate 101. Accordingly, light may be emitted through the first, second, and third LED stacks 21, 31, and 41, and the first, second, third, and fourth bump pads 20, 30, 40, and 50 may support the first, second, and third LED stacks 21, 31, and 41. The first, second, third, and fourth bump pads 20, 30, 40, and 50 may include metal, such as Cu, Ti, Ni, Ta, Pt, Pd, Cr, and the like. A multilayer solder barrier layer may be formed on an upper surface of each of the first, second, third, and fourth bump pads 20, 30, 40, and 50. For example, a surface layer, such as Au and Ag, may be further formed on the surface of each of the first, second, third, and fourth bump pads 20, 30, 40, and 50.

The LED stacks 21, 31, and 41 may be arranged under the first, second, third, and fourth bump pads 20, 30, 40, and 50. The second LED stack 31 may be bonded to an upper surface of the first LED stack 21, and thereafter, the third LED stack 41 may be bonded to an upper surface of the second LED stack 31. In this manner, the light emitting device 100 may have a single chip structure of a single pixel.

In an exemplary embodiment, the LED stacks 21, 31, and 41 may emit light having a shorter wavelength with increasing distance from the bump pads 20, 30, 40, and 50. For example, the first LED stack 21 disposed further away from the bump pads 20, 30, 40, and 50 may be a light emitting device configured to emit blue light, and the second LED stack 31 may be a light emitting device configured to emit green light. The third LED stack 41 may be a light emitting device configured to emit red light. Each of the first LED stack 21 and the second LED stack 31 may include a GaInN well layer, and the third LED stack 41 may include a GaInP well layer. However, the inventive concepts are not limited thereto. In some exemplary embodiments, when the light emitting device 100 includes a micro-LED having a surface area of less than about 4,000 $\mu m^2$ or 2,500 $\mu m^2$, the first LED stack 21 may emit at least one of red, green, and blue light, and the second and third LED stacks 31, 41 may emit other types of light, which is different from the light emitted from the first LED stack 21, among red, green, and blue light.

The second LED stack 31 may be disposed on the first LED stack 21, and the third LED stack 41 may be disposed on the second LED stack 31. When the third LED stack 41 emits light having a longer wavelength than those emitted from the first and second LED stacks 21, and 31, light generated in the third LED stack 41 may be emitted to the outside through the first and second LED stacks 21 and 31. In addition, when the second LED stack 31 emits light having a longer wavelength than that emitted from the first LED stack 21, light generated in the second LED stack 31 may be emitted to the outside through the first LED stack 21.

In another exemplary embodiment, the first LED stack 21 and the second LED stack 31 may be interchanged with each other. In particular, the first LED stack 21 may be interposed between the second LED stack 31 and the third LED stack 41. In this case, light generated in the third LED stack 41 may be emitted to the outside through the first and second LED stacks 21 and 31, and light generated in the first LED stack 21 may be emitted to the outside through the second LED stack 31. Since the first LED stack 21 emits light of a shorter wavelength than that emitted from the second LED stack 31, a portion of light generated from the first LED stack 21 may be absorbed by the second LED stack 31. Accordingly, luminance of light emitted from the first LED stack 21 may be reduced. In addition, by disposing the second LED stack 31 close to a light exiting surface, luminance of light emitted from the second LED stack 31 may be relatively increased. In this manner, a luminous intensity ratio of light emitted from the first LED stack 21, the second LED stack 31, and the third LED stack 41 may be adjusted by changing locations of the first LED stack 21 and the second LED stack 31.

Each of the first LED stack 21, the second LED stack 31, and the third LED stack 41 may include a first conductivity type semiconductor layer 21a, 31a, or 41a, a second conductivity type semiconductor layer 21b, 31b, or 41b, and an active layer interposed between the first conductivity type semiconductor layer 21a, 31a, or 41a and the second conductivity type semiconductor layer 21b, 31b, or 41b. The active layer may have a multi-quantum well structure.

In the LED stacks 21, 31, and 41, each of the first conductivity type semiconductor layers 21a, 31a, and 41a may be an n-type semiconductor layer, and each of the second conductivity type semiconductor layers 21b, 31b, and 41b may be a p-type semiconductor layer, without being limited thereto. Alternatively, the first conductivity type semiconductor layer 21a, 31a, or 41a of each of the LED stacks 21, 31, and 41 may be a p-type semiconductor layer, and the second conductivity type semiconductor layer 21b, 31b, or 41b of each of the LED stacks 21, 31, and 41 may be an n-type semiconductor layer.

As shown in FIG. 2B, in the first, second, and third LED stacks 21, 31, and 41, each of the first conductivity type semiconductor layers 21a, 31a, and 41a may have a surface texture to improve light extraction efficiency. The surface texture may be formed in a direction in which light generated in the first, second, and third LED stacks 21, 31, and 41 is extracted, without being limited thereto. When the first LED stack 21 emits blue light, blue light may have better visibility than red light or green light, and the first LED stack 21 may be formed to have higher radiation efficiency than the second LED stack 31 and the third LED stack 41. Accordingly, the second LED stack 31 and the third LED stack 41 are subjected to surface texturing to a greater extent than the first LED stack 21, thereby achieving substantially uniform intensity of red light, green light, and blue light. However, the inventive concepts are not limited thereto, and the first LED stack 21 may have a flat surface without the surface texture in other exemplary embodiments.

The first, second, and third transparent electrodes 23, 33, and 43 may be in ohmic contact with the second conductivity type semiconductor layers 21b, 31b, and 41b of the LED stacks 21, 31, and 41 so as to assist in current spreading, respectively. The first, second, and third transparent electrodes 23, 33, and 43 may include a conductive oxide layer, such as $SnO_2$, $InO_2$, ITO, ZnO, IZO, and the like.

The first transparent electrode 23 may be disposed between the first LED stack 21 and the second LED stack 31. More specifically, the first transparent electrode 23 may be interposed between the first LED stack 21 and the first protection layer 25. The first transparent electrode 23 may be in ohmic contact with the second conductivity type semiconductor layer 21b of the first LED stack 21. The first transparent electrode 23 may include a metal layer or a conductive oxide layer that transmits red light and green light. The first transparent electrode 23 may also transmit blue light. The first transparent electrode 23 may include a metal layer or a conductive oxide layer, such as an indium tin oxide (ITO) layer and the like.

The second transparent electrode 33 may be disposed between the second LED stack 31 and the third LED stack 41. More specifically, the second transparent electrode 33 may be interposed between the second LED stack 31 and the second protection layer 35. The second transparent electrode 33 may be in ohmic contact with the second conductivity type semiconductor layer 31b of the second LED stack 31. The second transparent electrode 33 may include a metal layer or a conductive oxide layer that transmits red light and green light.

The third transparent electrode 43 may be disposed on the third LED stack 41. More specifically, the third transparent electrode 43 may be interposed between the third LED stack 41 and the third protection layer 45. The third transparent electrode 43 may be in ohmic contact with the second conductivity type semiconductor layer 41b of the third LED stack 41. The third transparent electrode 43 may include a conductive oxide layer, such as an indium tin oxide (ITO) layer and the like, and may further include a reflective metal to reflect light emitted from the third LED stack 41.

The first protection layer 25 may be disposed on the first LED stack 21, more specifically between the first transparent electrode 23 and the first insulation layer 27. The first protection layer 25 may include a plurality of openings. The openings may be formed for electrical connection to the first conductivity type semiconductor layer 21a and the second conductivity type semiconductor layer 21b of the first LED stack 21. The openings may expose at least some regions of the first transparent electrode 23 and the first conductivity type semiconductor layer 21a.

The first protection layer 25 may be a transparent insulation layer having a lower index of refraction than that of the first LED stack 21. The first protection layer 25 may function as a hard mask upon etching of the first LED stack 21 in a vertical shape so as to expose the first conductivity type semiconductor layer 21a of the first LED stack 21.

The second protection layer 35 may be disposed on the second LED stack 31, more specifically between the second transparent electrode 33 and the second insulation layer 37. The second protection layer 35 may include a plurality of openings. The openings may be formed for electrical connection to the first conductivity type semiconductor layers 21a and 31a and the second conductivity type semiconductor layers 21b and 31b of the first and second LED stacks 21 and 31. The openings may expose at least some regions of the first conductivity type semiconductor layer 31a and the second transparent electrode 33 of the second LED stack 31, and may be placed coaxially with the openings of the first protection layer 25.

The second protection layer 35 may be a transparent insulation layer having a lower index of refraction than that of the second LED stack 31. The second protection layer 35 may be formed of the same material as the first protection layer 25, without being limited thereto. The second protection layer 35 may function as a hard mask upon etching of the first and second LED stacks 21 and 31 in a vertical shape so as to form holes for electrical connection to the second conductivity type semiconductor layers 21b and 31b of the first and second LED stacks 21 and 31.

The third protection layer 45 may be disposed on the third LED stack 41, more specifically between the third transparent electrode 43 and the third insulation layer 47. The third protection layer 45 may include a plurality of openings. The openings may be formed for electrical connection to the first conductivity type semiconductor layers 21a, 31a, and 41a and the second conductivity type semiconductor layers 21b, 31b, and 41b of the first, second, and third LED stacks 21, 31, and 41. The openings may expose the third transparent electrode 43 and at least some region of the first conductivity type semiconductor layer 41a of the third LED stack 41, and may be disposed coaxially with the openings of the first and second protection layers 25, 35.

The third protection layer 45 may be a transparent insulation layer having a lower index of refraction than that of the third LED stack 41. In addition, the third protection layer 45 may be formed of a distributed Bragg reflector (DBR) by stacking insulation layers having different indices of refraction. The distributed Bragg reflector may be formed by alternately stacking at least two insulation layers selected from $SiO_2$, $TiO_2$, $Nb_2O_5$, $Si_3N_4$, SiON, and $Ta_2O_5$. The third protection layer 45 may be formed of the same material as the first and second protection layers 25 and 35, without being limited thereto.

In addition, the third protection layer 45 may function as a hard mask upon etching of the first, second, and third LED stacks 21, 31, and 41 in a vertical shape so as to form holes for electrical connection to the second conductivity type semiconductor layers 21b, 31b, and 41b of the first, second, and third LED stacks 21, 31, and 41.

The first, second, and third protection layers 25, 35, and 45 may be formed of an insulating material, for example, $SiO_2$, SiNx, and the like. In the illustrated exemplary embodiment, the first, second, and third protection layers 25, 35, and 45 may be formed of $SiO_2$, without being limited thereto. In some exemplary embodiments, the first, second, and third protection layers 25, 35, and 45 may be formed of substantially the same material or different materials.

The first insulation layer 27 may cover and protect side surfaces of the first LED stack 21 and the first transparent electrode 23 exposed through first and fourth holes h1 and h4, which are formed by the openings of the first protection layer 25, so as to prevent current leakage. However, the first insulation layer 27 may expose at least a portion of the first conductivity type semiconductor layer 21a of the first LED stack 21 to form connection electrodes thereon, which will be further described below.

The second insulation layer 37 may cover and protect side surfaces of the second LED stack 31 and the second transparent electrode 33 exposed through the first, second and fourth holes h1, h2, h4, which are formed by the openings of the second protection layer 35, to prevent current leakage. However, the second insulation layer 37 may expose at least a portion of the first conductivity type semiconductor layer 31a of the second LED stack 31 to form the connection electrodes thereon, which will be further described below.

The third insulation layer 47 may cover and protect side surfaces of the second LED stack 31 and the third transparent electrode 43 exposed through the first, second, third, and fourth holes h1, h2, h3, and h4, which are formed by the openings of the third protection layer 45, so as to prevent current leakage. However, the third insulation layer 47 may expose at least a portion of the first conductivity type semiconductor layer 41a of the third LED stack 41 so as to form the connection electrodes thereon, which will be further described below.

The first, second, and third insulation layers 27, 37, and 47 may be formed of an insulating material, for example, $SiO_2$, SiNx, and the like. In the illustrated exemplary embodiment, the first, second, and third protection layers 25, 35, and 45 may be formed of SiN, without being limited thereto. In some exemplary embodiments, the first, second, and third insulation layers 27, 37, and 47 may be formed of substantially the same material or different materials.

The first bonding layer 29 may be interposed between the second LED stack 31 and the first LED stack 21, and may bond the second LED stack 31 to the first LED stack 21. The first bonding layer 29 may be formed on the first insulation layer 27.

The second bonding layer 39 may be interposed between the third LED stack 41 and the second LED stack 31, and may bond the third LED stack 41 to the second LED stack 31. The second bonding layer 39 may be disposed on the second insulation layer 37. The second bonding layer 39 may be formed to adjoin the second LED stack 31, without being limited thereto.

Each of the first and second bonding layers 29 and 39 may be a transparent organic or inorganic layer. The organic layer may be formed of, for example, SUB, poly(methyl methacrylate) (PMMA), polyimide, Parylene, and benzocyclobutene (BCB), and the inorganic layer may be formed of, for example, $Al_2O_3$, $SiO_2$, and SiNx. The second bonding layer 39 may be formed of, for example, spin-on-glass (SOG). According to the illustrated exemplary embodiment, the first and second bonding layers 29 and 39 may be formed of substantially the same material, without being limited thereto.

The first, second, third, and fourth holes h1, h2, h3, and h4 may be formed to pass through at least portions of the first, second, and third LED stacks 21, 31, and 41 by the openings of the first, second, and third transparent electrodes 23, 33, and 43, the first, second, and third protection layers 25, 35, and 45, and the first, second, and third insulation layers 27, 37, and 47.

The first, second, third, and fourth holes h1, h2, h3, and h4 may be formed through the third insulation layer 47. The first hole h1 may be formed through the third insulation layer 47, the third protection layer 45, the third transparent electrode 43, the third LED stack 41, the second bonding layer 39, the second insulation layer 37, the second protection layer 35, the second transparent electrode 33, the second LED stack 31, the first bonding layer 29, the first insulation layer 27, and the first protection layer 25 for electrical connection to the first transparent electrode 23.

The second hole h2 may be formed through the third insulation layer 47, the third protection layer 45, the third transparent electrode 43, the third LED stack 41, the second bonding layer 39, the second insulation layer 37, and the second protection layer 35 for electrical connection to the second transparent electrode 33.

The third hole h3 may be formed through the third insulation layer 47 and the third protection layer 45 for electrical connection to the third transparent electrode 43.

The fourth hole h4 may be formed through the third insulation layer 47, the third protection layer 45, the third transparent electrode 43, the third LED stack 41, the second bonding layer 39, the second insulation layer 37, the second protection layer 35, the second transparent electrode 33, the second LED stack 31, the first bonding layer 29, the first insulation layer 27, the first protection layer 25, the second conductivity type semiconductor layer 21b, and at least a portion of the first conductivity type semiconductor layer 21a of the first LED stack 21 to provide a region for electrical connection to the first conductivity type semiconductor layers 21a, 31a, and 41a of the first, second, and third LED stacks 21, 31, and 41.

The fourth hole h4 may have a step S, as shown in FIG. 2B. By the step S, a first width W1 of the fourth hole h4 formed in a region of the first bonding layer 29 and the first conductivity type semiconductor layer 31a of the second LED stack 31 may be narrower than a second width W2 of the fourth hole h4 formed in a region of the second LED stack 31, the second transparent electrode 33, the second protection layer 35, and the second insulation layer 37. In addition, a region of the fourth hole h4 formed in the second bonding layer 39 and the first conductivity type semiconductor layer 41a of the third LED stack 41 may have a narrower width than a region of the fourth hole h4 formed in the third LED stack 41, the third transparent electrode 43, the third protection layer 45, and the third insulation layer 47.

In the illustrated exemplary embodiment, the first, second, and third holes h1, h2 and h3 are exemplarily shown as being separated from one another, and the second conductivity type semiconductor layers 21b, 31b, and 41b of the first, second, and third LED stacks 21, 31, and 41 are described as being electrically connected to one another therethrough. However, the inventive concepts are not limited thereto, and in some exemplary embodiments, the second conductivity type semiconductor layers 21b, 31b, and 41b of the first, second, and third LED stacks 21, 31, and 41 may be electrically connected to one another through a single hole.

The first, second, and third connection electrodes 61a, 61b, 61c, 63a, 63b, and 65a and the common electrodes 67a, 67b, and 67c may be disposed in the corresponding holes h1, h2, h3, and h4.

The first connection electrodes 61a, 61b, and 61c may include a first-1 connection electrode 61a, a first-2 connection electrode 61b, and a first-3 connection electrode 61c, which may be disposed in the first hole h1. The first-1 connection electrode 61a may have a greater width than the first-2 and first-3 connection electrodes 61b and 61c. In addition, the first-2 connection electrode 61b may have a greater width than the first-3 connection electrode 61c. Accordingly, the widths of the first connection electrodes 61a, 61b, and 61c may gradually decrease in a direction from the first LED stack 21 to the third LED stack 41. The first connection electrodes 61a, 61b, and 61c may be electrically connected to the second conductivity type semiconductor layer 21b of the first LED stack 21 through the first transparent electrode 23.

The second connection electrodes 63a and 63b may include a second-1 connection electrode 63a and a second-2 connection electrode 63b, which may be disposed in the second hole h2. The second-1 connection electrode 63a may have a greater width than the second-2 connection electrode 63b. Accordingly, the widths of the second connection electrodes 63a and 63b may gradually decrease in a direction from the second LED stack 31 to the third LED stack 41. The second connection electrodes 63a and 63b may be electrically connected to the second conductivity type semiconductor layer 31b of the second LED stack 31 through the second transparent electrode 33.

The third connection electrode 65a may be disposed in the third hole h3. The third connection electrode 65a may be electrically connected to the second conductivity type semiconductor layer 41b of the third LED stack 41 through the third transparent electrode 43.

The first, second, and third connection electrodes 61a, 61b, 61c, 63a, 63b, and 65a may include a plurality of metal layers formed of metal, for example, Cu, Ni, Ti, Sb, Mo, Co, Sn, Ag, and an alloy thereof, without being limited thereto. The first, second, and third connection electrodes 61a, 61b, 61c, 63a, 63b, and 65a may be formed of the same material, without being limited thereto.

The common electrodes 67a, 67b, and 67c may include a first-1 common electrode 67a, a first-2 common electrode 67b, and a first-3 common electrode 67c, which may be disposed in the fourth hole h4. In particular, the first-2 common electrode 67b and the first-3 common electrode 67c in the fourth hole h4 may be formed to have a step S. For example, the first-2 common electrode 67b may be formed in the fourth hole h4, such that the first width W1 of the first-2 common electrode 67b formed in the region of the fourth hole h4 in the first bonding layer 29 and the first conductivity type semiconductor layer 31a of the second LED stack 31 is narrower than the second width W2 of the first-2 common electrode 67b formed in the fourth hole h4 in the region of the second LED stack 31, the second transparent electrode 33, the second protection layer 35, and the second insulation layer 37. The first width W1 may be at least one third of the second width W2, for example. More specifically, the first width W1 may be in a range of about 5 µm to about 7 µm, and the second width W2 may be in a range of about 1 µm to about 3 µm, without being limited thereto. The first-3 common electrode 67c may have substantially the same structure as the first-2 common electrode 67b. Accordingly, the first-3 common electrode 67c may also have a step S. The maximum width of each of the common electrodes 67a, 67b, and 67c may be substantially the same.

The steps S may form regions that expose the first conductivity type semiconductor layer 31a of the second LED stack 31 and the first conductivity type semiconductor layer 41a of the third LED stack 41, and may substantially adjoin the first-2 and first-3 common electrodes 67b and 67c, such that the first-2 and first-3 common electrodes 67b and 67c are electrically connected to each other therethrough. In addition, the steps S substantially reduce areas of the common electrodes 67a, 67b, and 67c, thereby securing larger luminous areas of the second and third LED stacks 31 and 41. Accordingly, the second and third LED stacks 31 and 41 may have greater luminous areas, thereby improving light extraction efficiency.

Each of the common electrodes 67a, 67b, and 67c may include a plurality of metal layers formed of metal, for example, Cu, Ni, Ti, Sb, Mo, Co, Sn, Ag, and an alloy thereof, without being limited thereto. The common electrodes 67a, 67b, and 67c may be formed of substantially the same material as the first, second, and third connection electrodes 61a, 61b, 61c, 63a, 63b, and 65a, without being limited thereto.

The first, second, and third connection electrodes 61a, 61b, 61c, 63a, 63b, and 65a and the common electrodes 67a, 67b, and 67c may further include seed layers 71a, 71b, 71c, 73a, 73b, 75a, 77a, 77b, and 77c for forming metal layers in a course of plating, respectively. Each of the seed layers 71a, 71b, 71c, 73a, 73b, 75a, 77a, 77b, and 77c may include a plurality of metal layers, for example, a Ti/Cu structure, without being limited thereto. The seed layers 71a, 71b, 71c, 73a, 73b, 75a, 77a, 77b, and 77c may reflect light extracted from the first, second, and third LED stacks 21, 31, and 41, thereby improving light extraction efficiency.

The first, second, third, and fourth bump pads 20, 30, 40, and 50 may be disposed to adjoin upper surfaces of the first-3, second-2, and third-1 connection electrodes 61c, 63b, and 65a, an upper surface of the first-3 common electrode 67c, and at least a portion of an upper surface of the third insulation layer 47, and may be electrically connected to the first, second, and third LED stacks 21, 31, and 41.

As shown in FIG. 2B, the first-1 connection electrode 61a, the first-2 connection electrode 61b, and the first-3 connection electrode may be arranged along a straight line so as to overlap with one another. In addition, the second-1 connection electrode 63a and the second-2 connection electrode 63b may be disposed along a straight line so as to overlap with one another. Furthermore, the first-1 common electrode 67a, the first-2 common electrode 67b, and the first-3 common electrode 67c may also be disposed along a straight line so as to overlap with one another. In this manner, loss of light generated from the first LED stack 21, the second LED stack 31, and the third LED stack 41 may be significantly reduced, which may otherwise occur from being absorbed or blocked by the connection electrodes and the common electrodes.

The first bump pad 20 may be disposed over the first hole h1 and electrically connected to the second conductivity type semiconductor layer 21b of the first LED stack 21 through the first-3 connection electrode 61c, the first-2 connection electrode 61b, the first-1 connection electrode 61a, and the first transparent electrode 23.

The second bump pad 30 may be disposed over the second hole h2 and electrically connected to the second conductivity type semiconductor layer 31b of the second LED stack 31 through the second-2 connection electrode 63b, the second-1 connection electrode 63a, and the second transparent electrode 33.

The third bump pad 40 may be disposed over the third hole h3 and electrically connected to the second conductivity type semiconductor layer 41b of the third LED stack 41 through the third-1 connection electrode 65a and the third transparent electrode 43.

The fourth bump pad 50 may be disposed over the fourth hole h4 and commonly electrically connected to the first conductivity type semiconductor layers 21a, 31a, and 41a of the first, second, and third LED stacks 21, 31, and 41 through the first-3 common electrode 67c, the first-2 common electrode 67b, and the first-1 common electrode 67a.

The first LED stack 21 may be electrically connected to the first and fourth bump pads 20 and 50, the second LED stack 31 may be electrically connected to the second and fourth bump pads 30 and 50, and the third LED stack 41 may be electrically connected to the third and fourth bump pads 40 and 50. Accordingly, cathodes of the first, second, and third LED stacks 41 may be commonly electrically connected to the fourth bump pad 50, and anodes thereof may be electrically connected to the first, second, and third bump pads 20, 30 and 40, respectively. Accordingly, the first, second, and third LED stacks 21, 31, and 41 may be driven independently.

According to an exemplary embodiment, the first, second, third, and fourth bump pads 20, 30, 40, and 50 may be formed at various locations. For example, for the light emitting device 100 having a rectangular shape as shown in FIG. 2A, the first, second, third, and fourth bump pads 20, 30, 40, and 50 may be disposed near corners of the rectangular shape, respectively. However, the inventive concepts are not limited thereto, as when the light emitting device 100 has various shapes, and the first, second, third, and fourth bump pads 20, 30, 40, and 50 may also be formed at different locations according to the shape of the light emitting device 100.

The first, second, third, and fourth bump pads 20, 30, 40, and 50 may include metal, for example, Cu, Ni, Ti, Sb, Mo, Co, Sn, Ag, or an alloy thereof, without being limited thereto.

FIG. 3A, FIG. 3B, FIG. 3C, FIG. 4A, FIG. 4B, FIG. 4C, FIG. 4D, FIG. 4E, FIG. 4F, FIG. 5A, and FIG. 5B are schematic cross-sectional views illustrating a method of manufacturing the light emitting device according to an exemplary embodiment.

Figure 3A:
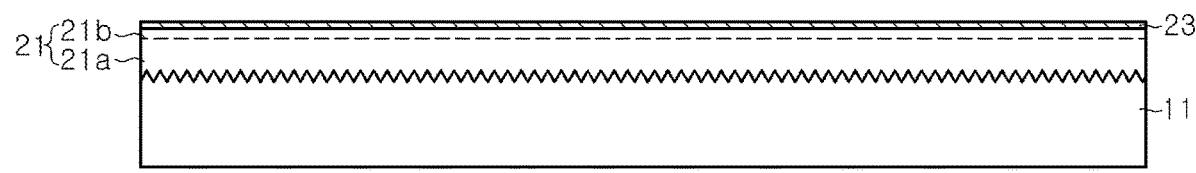
FIG. 3A, FIG. 3B, FIG. 3C, FIG. 4A, FIG. 4B, FIG. 4C, FIG. 4D, FIG. 4E, FIG. 4F, FIG. 5A, and FIG. 5B are schematic cross-sectional views illustrating a process of manufacturing the light emitting device shown in FIG. 2A.

Referring to FIG. 3A, a first LED stack 21 may be grown on a substrate 11 and a first transparent electrode 23 may be formed on the first LED stack 21. The first LED stack 21 may include AlGaInN semiconductor layers, and may include a first conductivity type semiconductor layer 21a, an active layer, and a second conductivity type semiconductor layer 21b. The first conductivity type semiconductor layer 21a may be an n-type semiconductor layer, and the second conductivity type semiconductor layer 21b may be a p-type semiconductor layer, without being limited thereto.

The substrate 11 may be a substrate capable of growing GaN semiconductor layers thereon, and a composition ratio of AlGaInN for the first LED stack 21 may be determined, such that the first LED stack 21 emits, for example, blue light. The first transparent electrode 23 may be in ohmic contact with the second conductivity type semiconductor layer 21b. The first transparent electrode 23 may be formed of a conductive oxide layer, such as $SnO_2$, $InO_2$, ITO, ZnO, and IZO. The substrate 11 may have a roughened surface to face the first conductivity type semiconductor layer 21a.

Figure 3B:

Referring to FIG. 3B, a second LED stack 31 may be grown on a growth substrate, and a second transparent electrode 33 may be formed on the second LED stack 31. Thereafter, a first temporary substrate 13 may be disposed on the second transparent electrode 33. The second LED stack 31 is separated from the growth substrate, and a temporary bonding de-bonding (TBDB) process may be performed using the first temporary substrate 13 as a temporary substrate for a subsequent process. More specifically, the first temporary substrate 13 may be bonded to an upper surface of the second transparent electrode 33, followed by separating the growth substrate from the second LED stack 31. The first temporary substrate 13 may be removed after the second LED stack 31 is bonded to the first LED stack 21.

The second LED stack 31 may include AlGaInP or AlGaInN semiconductor layers, and may include a first conductivity type semiconductor layer 31a, an active layer, and a second conductivity type semiconductor layer 31b. The first conductivity type semiconductor layer 31a may be an n-type semiconductor layer, and the second conductivity type semiconductor layer 31b may be a p-type semiconductor layer, without being limited thereto. A composition ratio of AlGaInN for the second LED stack 31 may be determined to enable the second LED stack 31 to emit, for example, green light.

The second transparent electrode 33 may be in ohmic contact with the second conductivity type semiconductor layer 31b of the second LED stack 31. The second transparent electrode 33 may be formed of a metal layer or a conductive oxide layer, such as $SnO_2$, $InO_2$, ITO, ZnO, and IZO.

Figure 3C:

Referring to FIG. 3C, a third LED stack 41 may be grown on a growth substrate, a third transparent electrode 43 may be formed on the third LED stack 41, and a second temporary substrate 15 may be disposed on the third transparent electrode 43. The third LED stack 41 is separated from a growth substrate, and the temporary bonding de-bonding (TBDB) process may be performed using the second temporary substrate 15 as a temporary substrate for a subsequent process. More specifically, the second temporary substrate 15 may be bonded to an upper surface of the third transparent electrode 43, followed by separating the growth substrate from the third LED stack 41. The second temporary substrate 15 may be removed after the second LED stack 31 is bonded to the third LED stack 41.

The third LED stack 41 may include AlGaInP semiconductor layers, and may include a first conductivity type semiconductor layer 41a, an active layer, and a second conductivity type semiconductor layer 41b. The first conductivity type semiconductor layer 41a may be an n-type semiconductor layer, and the second conductivity type semiconductor layer 41b may be a p-type semiconductor layer, without being limited thereto. The third LED stack 41 may emit, for example, red light.

The third transparent electrode 43 may be in ohmic contact with the second conductivity type semiconductor layer 41b of the third LED stack 41. The third transparent electrode 43 may be formed of a metal layer or a conductive oxide layer, such as $SnO_2$, $InO_2$, ITO, ZnO, and IZO.

Figure 4A:
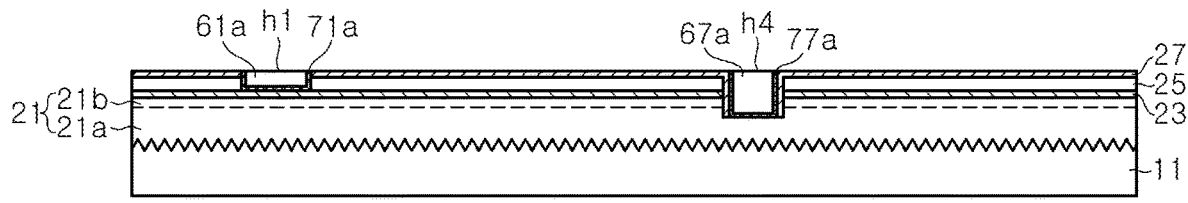

Referring to FIG. 4A, the first protection layer 25 may be formed on the first transparent electrode 23. According to an exemplary embodiment, at least portions of the first LED stack 21, the first transparent electrode 23, and the first protection layer 25 may be etched to form an opening exposing the first conductivity type semiconductor layer 21a. Thereafter, the first insulation layer 27 may be formed to cover the first LED stack 21, a side surface of the first transparent electrode 23, and side and upper surfaces of the first protection layer 25.

A portion of the first insulation layer 27 may be etched to define the fourth hole h4 exposing the first conductivity type semiconductor layer 21a, and a first-1 common electrode 67a may be formed in the fourth hole h4. The first-1 common electrode 67a may be electrically connected to the first conductivity type semiconductor layer 21a of the first LED stack 21.

In addition, portions of the first insulation layer 27 and the first protection layer 25 may be etched to form an opening that defines the first hole h1, and a first-1 connection electrode 61a may be formed in the first hole h1. The first-1 connection electrode 61a may be electrically connected to the second conductivity type semiconductor layer 21b of the first LED stack 21 through the first transparent electrode 23.

However, the inventive concepts are not limited to a particular sequence of forming the openings. For example, in some exemplary embodiments, the opening that defines the first hole h1 may be formed prior to forming the first insulation layer 27 on the first protection layer 25. In this case, a portion of the first insulation layer 27 subsequently formed on the first protection layer 25 may be further etched to expose the first transparent electrode 23.

The openings may be patterned by photolithography and etching, and may define regions in which the first-1 connection electrode 61a and the first-1 common electrode 67a will be formed. In addition, the first-1 connection electrode 61a and the first-1 common electrode 67a may be formed at the same time, without being limited thereto.

Figure 4B:
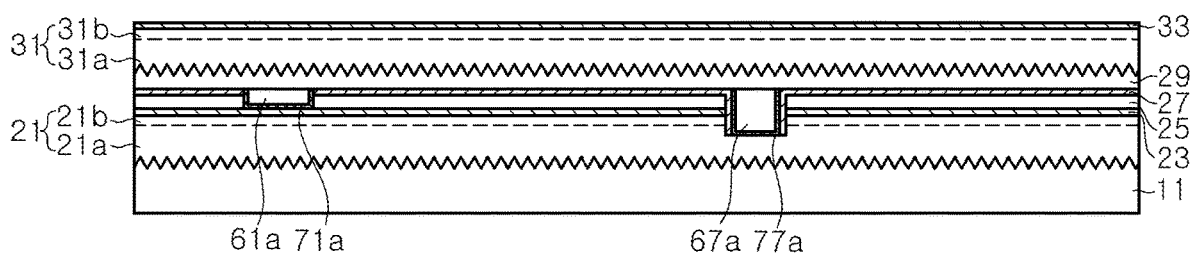

Referring to FIG. 4B, the second LED stack 31 may be bonded to the first LED stack 21. For bonding of the first LED stack 21 to the second LED stack 31, a first bonding layer 29 may be interposed between the first LED stack 21 and the second LED stack 31. For example, the first bonding layer 29 may be disposed on the first LED stack 21, and the second LED stack 31 may be disposed on the first bonding layer 29, followed by application of heat and pressure thereto. More specifically, the first bonding layer 29 and the first conductivity type semiconductor layer 31a of the second LED stack 31 may be bonded to each other while contacting each other. Then, the first temporary substrate 13 may be removed by a laser lift-off process, a chemical process, a mechanical process, and the like. As a result, an upper surface of the second transparent electrode 33 can be exposed.

Figure 4C:
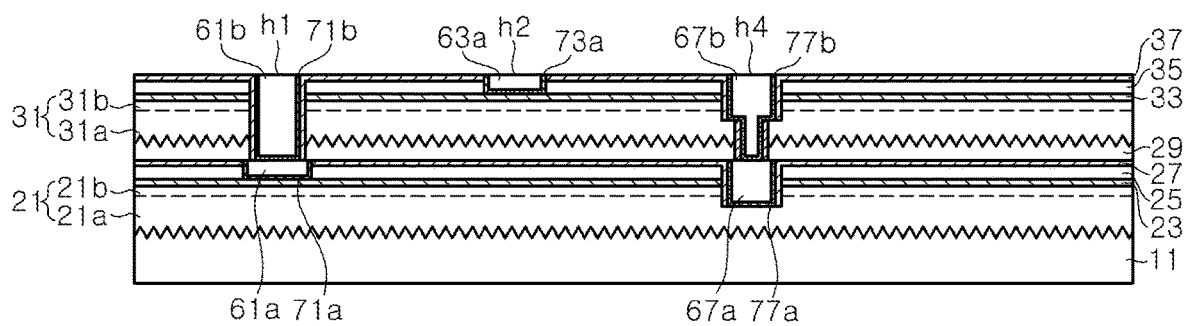

Referring to FIG. 4C, a second protection layer 35 and a second insulation layer 37 may be sequentially formed on the second transparent electrode 33.

The first bonding layer 29, the second LED stack 31, the second transparent electrode 33, the second protection layer 35, and the second insulation layer 37 may be formed to have an opening for electrical connection to the second conductivity type semiconductor layer 21b of the first LED stack 21. The opening may include at least a portion of the first hole h1, and a first-2 connection electrode 61b may be formed in the first hole h1. The first-2 connection electrode 61b may be electrically connected to the second conductivity type semiconductor layer 21b of the first LED stack 21 through the first-1 connection electrode 61a and the first transparent electrode 23.

In addition, the second protection layer 35 and the second insulation layer 37 may be formed to have an opening exposing the second transparent electrode 33. The opening may include at least a portion of the second hole h2, and a second-1 connection electrode 63a may be formed in the second hole h2. The second-1 connection electrode 63a may be electrically connected to the second conductivity type semiconductor layer 31b of the second LED stack 31 through the second transparent electrode 33.

In addition, the first bonding layer 29, the second LED stack 31, the second transparent electrode 33, the second protection layer 35, and the second insulation layer 37 may be formed to have an opening exposing the first conductivity type semiconductor layer 31a of the second LED stack 31. The opening may include at least a portion of the fourth hole h4, and a first-2 common electrode 67b may be formed in the fourth hole h4. The first-2 common electrode 67b may be electrically connected to the first conductivity type semiconductor layer 31a of the second LED stack 31. The openings may be patterned by photolithography and etching.

The openings may be patterned by photolithography and etching, and may define regions in which the first-2 and second-1 connection electrodes 61b and 63a and the first-2 common electrode 67b will be formed. In addition, the first-2 and second-1 connection electrodes 61b and 63a and the first-2 common electrode 67b may be formed at the same time, without being limited thereto.

Figure 4D:
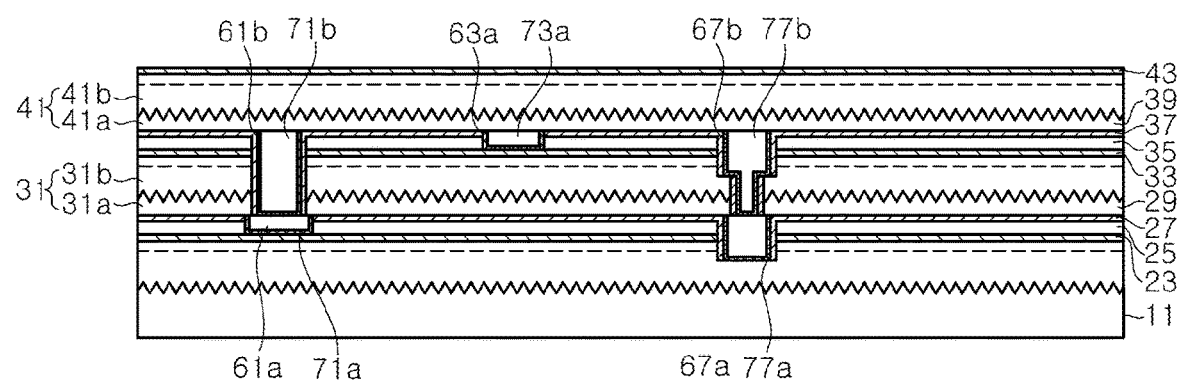

Referring to FIG. 4D, the second LED stack 31 may be bonded to the third LED stack 41. For bonding of the second LED stack 31 to the third LED stack 41, a second bonding layer 39 may be disposed between the second LED stack 31 and the third LED stack 41. Specifically, the second bonding layer 39 may be disposed on the second LED stack 31, and the third LED stack 41 may be disposed on the second bonding layer 39, followed by application of heat and pressure thereto. More specifically, the second bonding layer 39 and the first conductivity type semiconductor layer 41a of the third LED stack 41 may be bonded to each other while contacting each other. Then, the second temporary substrate 15 may be removed from the third LED stack 41 by a laser lift-off process, a chemical process, a mechanical process, and the like. As a result, an upper surface of the third transparent electrode 43 can be exposed.

Figure 4E:
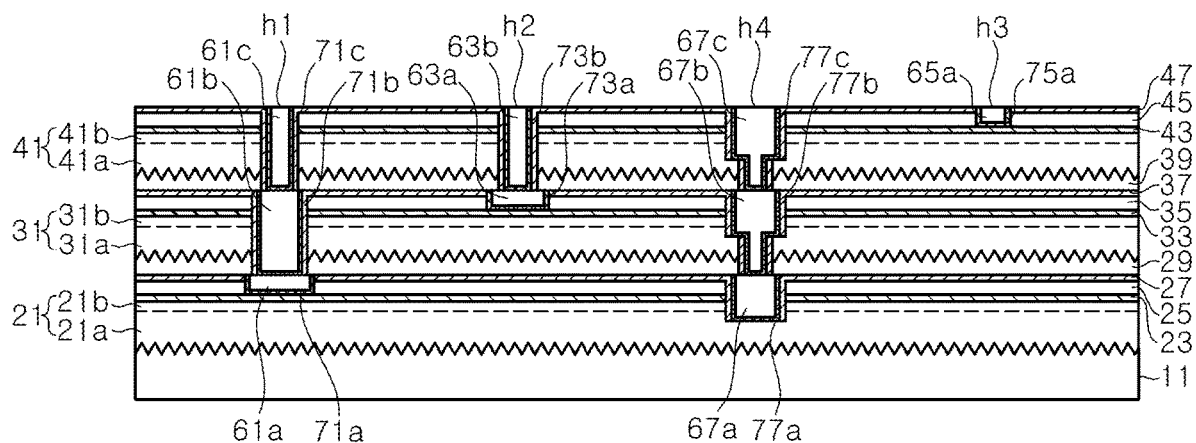

Referring to FIG. 4E, a third protection layer 45 and a third insulation layer 47 may be sequentially formed on the third transparent electrode 43.

The second bonding layer 39, the third LED stack 41, the third transparent electrode 43, the third protection layer 45, and the third insulation layer 47 may be formed to have an opening for electrical connection to the second conductivity type semiconductor layer 21b of the first LED stack 21. The opening may include at least a portion of the first hole h1, and a first-3 connection electrode 61c may be formed in the first hole h1. The first-3 connection electrode 61c may be electrically connected to the second conductivity type semiconductor layer 21b of the first LED stack 21 through the first-2 connection electrode 61b, the first-1 connection electrode 61a, and the first transparent electrode 23.

In addition, the second bonding layer 39, the third LED stack 41, the third transparent electrode 43, the third protection layer 45, and the third insulation layer 47 may be formed to have an opening for electrical connection to the second conductivity type semiconductor layer 31b of the second LED stack 31. The opening may include at least a portion of the second hole h2, and a second-2 connection electrode 63b may be formed in the second hole h1. The second-2 connection electrode 63b may be electrically connected to the second conductivity type semiconductor layer 31b of the second LED stack 31 through the second-1 connection electrode 63a and the second transparent electrode 33.

Further, the third protection layer 45 and the third insulation layer 47 may be formed to have an opening for electrical connection to the second conductivity type semiconductor layer 41b of the third LED stack 41. The opening may include at least a portion of the third hole h3, and a third-1 connection electrode 65a may be formed in the third hole h3. The third-1 connection electrode 65a may be electrically connected to the second conductivity type semiconductor layer 41b of the third LED stack 41 through the third transparent electrode 43.

In addition, the second bonding layer 39, the third LED stack 41, the third transparent electrode 43, the third protection layer 45, and the third insulation layer 47 may be formed to have an opening exposing the first conductivity type semiconductor layer 41a of the third LED stack 41. The opening may include at least a portion of the fourth hole h4, and a first-3 common electrode 67c may be formed in the fourth hole h4. The first-3 common electrode 67c may electrically contact the first conductivity type semiconductor layer 41a of the third LED stack 41.

The openings may be patterned by photolithography and etching, and may define region in which the first-3, second-2, and third-1 connection electrodes 61c, 63b, and 65a and the first-3 common electrode 67c will be formed. In addition, the first-3, second-2, and third-1 connection electrodes 61c, 63b, and 65a and the first-3 common electrode 67c may be formed at the same time, without being limited thereto.

Figure 4F:
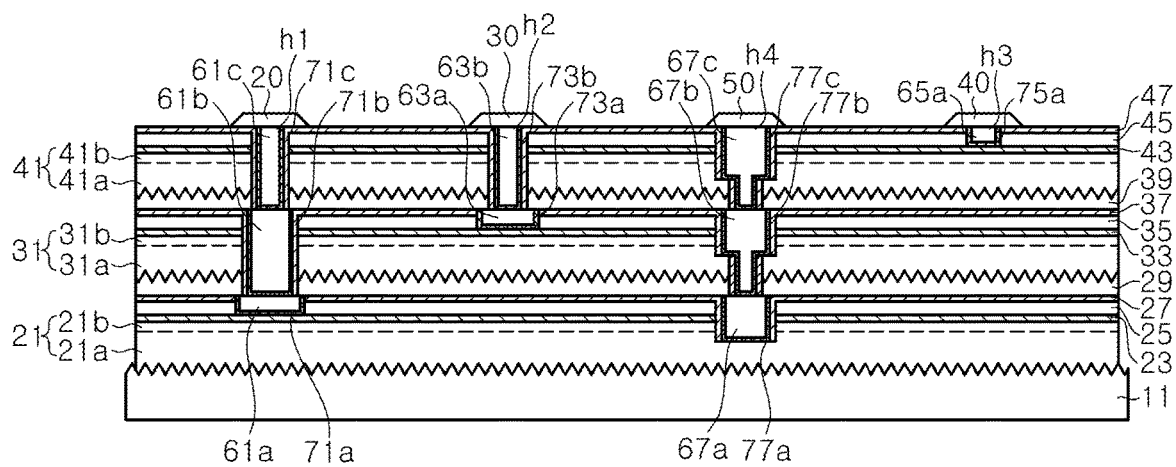

Referring to FIG. 4F, a roughened surface of the substrate 11 may be exposed by etching at least portions of outer surfaces of the first, second, and third LED stacks 21, 31, and 41. A plurality of light emitting devices 100 may be formed together on the substrate 11, and an isolation process for separating them may be performed to separate the light emitting devices 100 from one another on the substrate 11.

In addition, first, second, third, and fourth bump pads 20, 30, 40, and 50 may be formed on the third insulation layer 47. More specifically, the first, second, third, and fourth bump pads 20, 30, 40, and 50 may be formed on the first-3, second-2, and third-1 connection electrodes 61c, 63b, and 65a and the first-3 common electrode 67c, respectively.

The first bump pad 20 may be connected to the first connection electrodes 61a, 61b, and 61c, the second bump pad 30 may be connected to the second connection electrodes 63a and 63b, and the third bump pad 40 may be connected to the third connection electrode 65a through the respective openings of the third insulation layer 47. The fourth bump pad 50 may be commonly connected to the common electrodes 67a, 67b, and 67c through the opening of the third insulation layer 47.

Since the first, second, and third connection electrodes 61, 63, and 65 are electrically insulated from one another, each of the first, second, and third LED stacks 21, 31, and 41 may be electrically connected to two bump pads to be independently driven. The bump pads 20, 30, 40, and 50 may be formed after the isolation process, without being limited thereto.

Figure 5A:
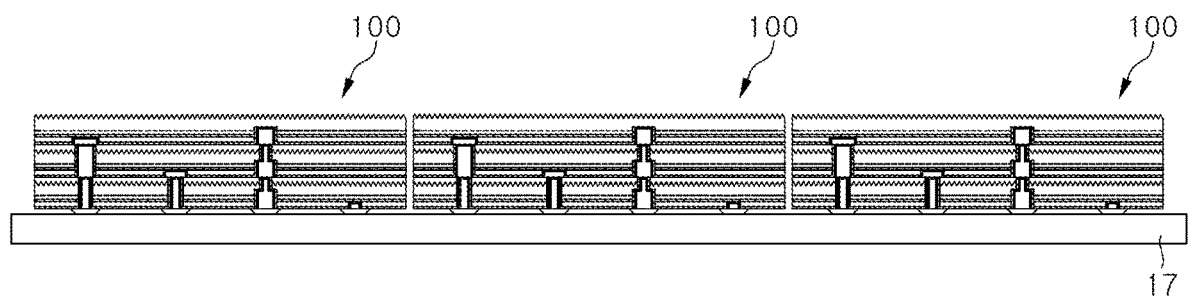

Referring to FIG. 5A, the light emitting devices 100 may be disposed on a third temporary substrate 17. As illustrated, the light emitting devices 100 may be disposed on the third temporary substrate 17 such that the bump pads 20, 30, 40, and 50 contact with the third temporary substrate 17. In addition, a bonding layer may be further interposed between the third temporary substrate 17 and the light emitting device 100. According to an exemplary embodiment, the substrate 11 may be removed from the light emitting device 100, and thus, the light emitting devices 100 may be separated from one another, without being limited thereto. Thereafter, the light emitting devices 100 may be transferred to the panel substrate 101 through various transferring methods, such as a transferring method using a stamp 110.

Figure 5B:
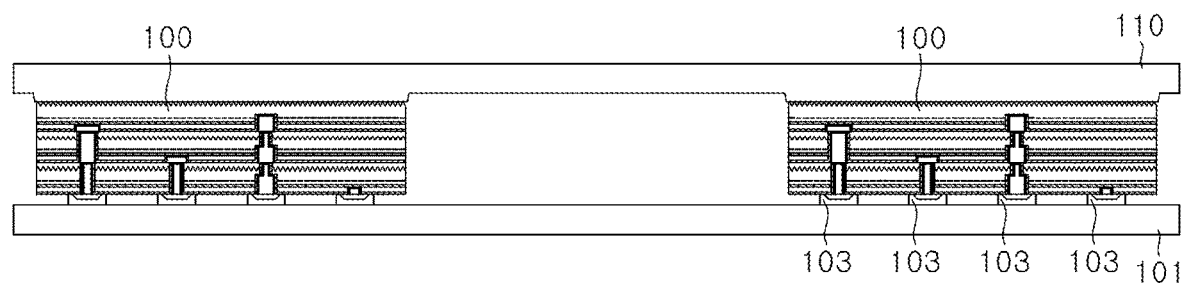

Referring to FIG. 5B, the light emitting devices 100 may be transferred onto the panel substrate 101 in FIG. 1 using the stamp 110. To transfer the light emitting devices 100 at a same interval as an electrode interval of the panel substrate 101, the stamp 110 may bond the light emitting devices 100 at the same interval as the electrode 103 interval on the panel substrate 101. Among the light emitting devices 100 separated from one another on the third temporary substrate 17, the light emitting devices 100 that are disposed at the same interval as the electrode 103 on the panel substrate 101 may be selectively bonded to the stamp 110 and transferred onto the panel substrate 101. In this case, the light emitting device 100 may have a surface texture on a surface in contact with the stamp 110, and thus, when the light emitting device 100 is picked up, a bonding strength between the light emitting device 100 and the stamp 110 may be strengthened.

In the light emitting devices according to exemplary embodiments, each component may be modified in various ways. Hereinafter, light emitting devices described below have different features than those described above, and repeated description of the substantially the same elements will be briefly described or omitted.

Figure 6A:
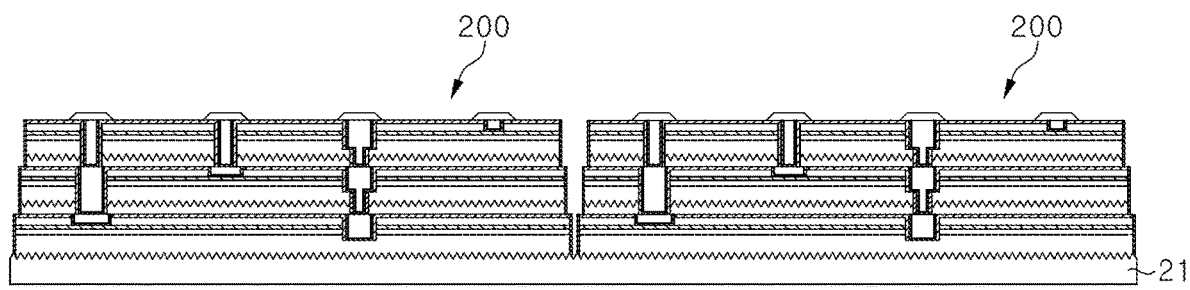
FIG. 6A is a schematic cross-sectional view of a light emitting device according to another exemplary embodiment.
Figure 6B:
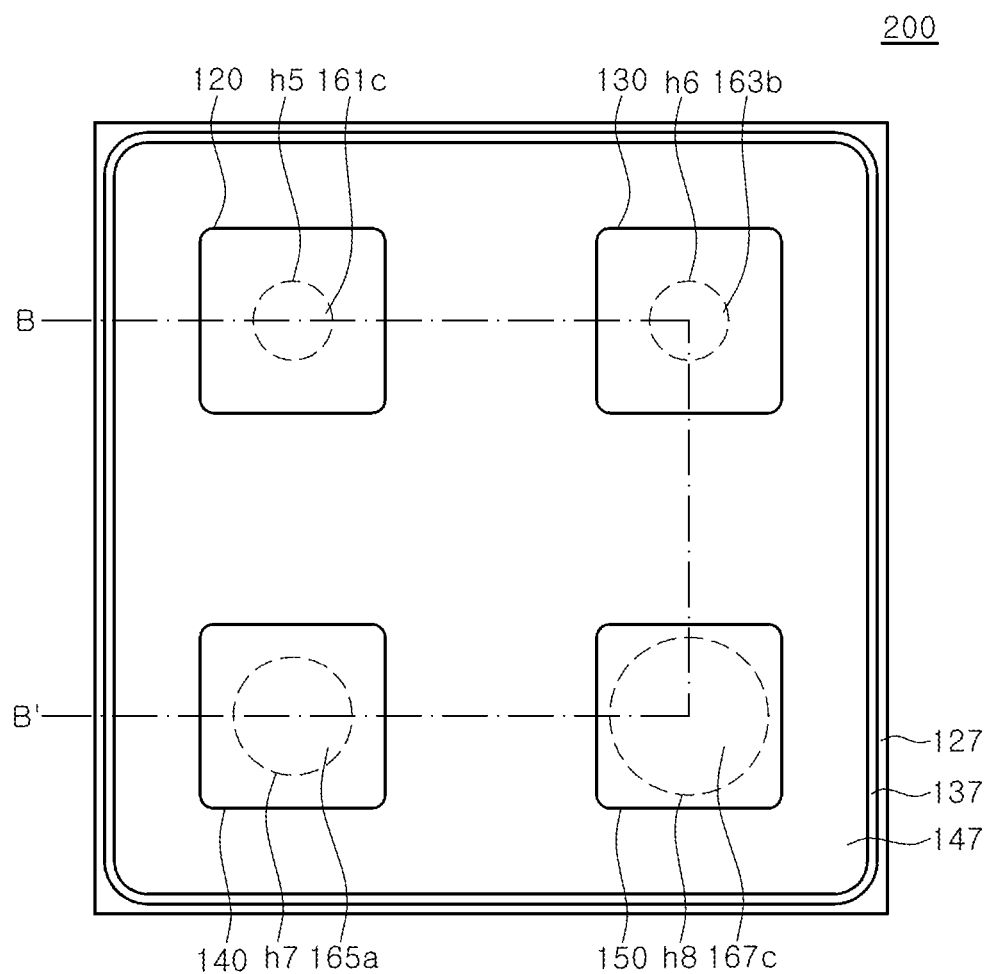
FIG. 6B is a top plan view of a light emitting device according to another exemplary embodiment.
Figure 6C:
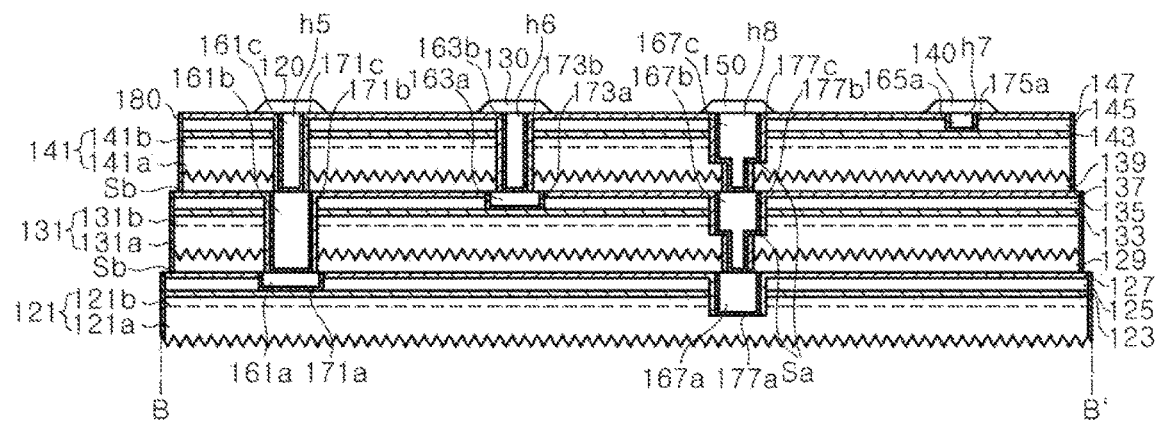
FIG. 6C is a schematic cross-sectional view taken along line B-B' of its corresponding plan view shown in FIG. 6B.

FIG. 6A, FIG. 6B, and FIG. 6C are a schematic plan view and cross-sectional views of a light emitting device 200 according to other exemplary embodiments.

Referring to FIG. 6A, FIG. 6B, and FIG. 6C, the light emitting device 200 has substantially the same configuration as the light emitting device shown in FIG. 2A and FIG. 2B, except for an outer surface of the light emitting device 200. The components of the light emitting device 200 that are identical to those of FIG. 2A and FIG. 2B are indicated as '1xx' whereby 'xx' refers to the reference numbers of corresponding components shown in FIGS. 2A and 2B. Meanwhile, the step S in FIG. 2B is denoted as a step 'Sa', and the first, second, third, and fourth holes h1, h2, h3, and h4 shown in FIGS. 2A and 2B are denoted as fifth, sixth, seventh, and eighth holes h5, h6, h7, and h8.

As shown in FIG. 6A, FIG. 6B and FIG. 6C, the light emitting device 200 may have steps 'Sb' on the outer surface thereof. The steps Sb on the outer surface of the light emitting device 200 may be simultaneously formed during etching for formation of fifth, sixth, seventh, and eighth holes h5, h6, h7, and h8. However, the inventive concepts are not limited thereto, and the steps 'Sb' may be formed by a separate process in other exemplary embodiments.

By the steps Sb, a first LED stack 121 may have a greater width than second and third LED stacks 131 and 141, and the second LED stack 131 may have a greater width than the third LED stack 141. As such, the first LED stack 121 may have a larger luminous area than the second and third LED stacks 131 and 141, and the second LED stack 131 may have a larger luminous area than the third LED stack 141. In addition, at least portions of upper surfaces of first and second insulation layers 127 and 137 may be exposed. The steps Sb may be simultaneously formed during etching for formation of the fifth, sixth, seventh, and eighth holes h5, h6, h7, and h8. Accordingly, a separate etching process for separation of the light emitting devices 200 can be omitted, thereby enabling simplification of a manufacturing process.

The light emitting device 200 may further include a reflection layer 180 on the outer surface. A portion of the reflection layer 180 covering the side surface of the first LED stack 21, a portion of the reflection layer 180 covering the side surface of the second LED stack 31, and a portion of the reflection layer 180 covering the side surface of the third LED stack 41 may be spaced apart from one another. More specifically, the reflection layer 180 may not be formed on at least a portion of upper surfaces of the first, second, and third insulation layers 127, 137, and 147 near the outer surface of the light emitting device 200. As such, the upper surfaces of at least portions of the first, second, and third insulation layers 127, 137, and 147 may be exposed.

The reflection layer 180 may include a metal layer, for example, a Ti layer. The reflection layer 180 may be formed simultaneously with seed layers 171a, 171b, 171c, 173a, 173b, 175a, 177a, 177b, and 177c, and may include the same material as at least some materials for the seed layers 171a, 171b, 171c, 173a, 173b, 175a, 177a, 177b, and 177c, without being limited thereto. As the reflection layer 180 covers a side surface of the light emitting device 200, the reflection layer 180 reflects light extracted emitted sideways from the first, second, and third LED stacks 120, 130, and 140, thereby improving light extraction efficiency of the light emitting device 200.

Figure 7:
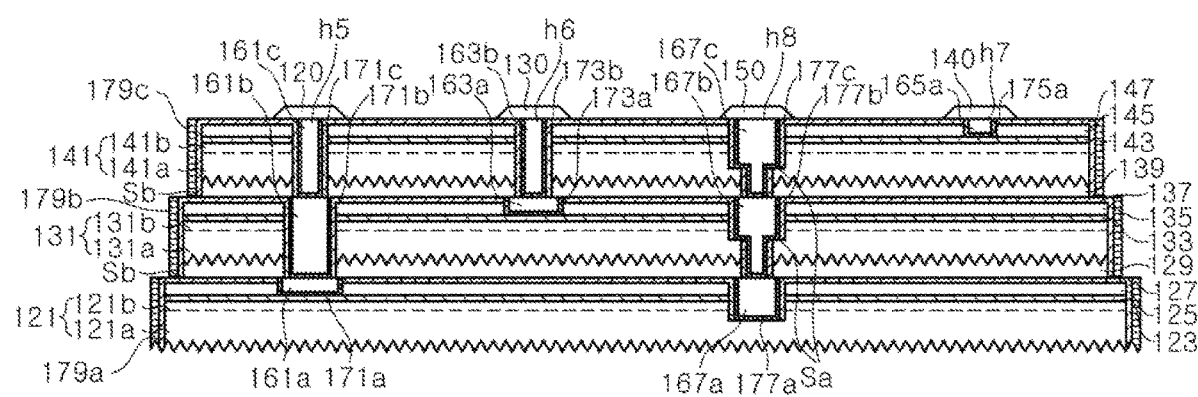
FIG. 7 is a schematic cross-sectional view illustrating a light emitting device according to another exemplary embodiment of the present disclosure.

FIG. 7 is a schematic cross-sectional view illustrating a light emitting device according to another exemplary embodiment.

Referring to FIG. 7, the light emitting device according to the illustrated exemplary embodiment is substantially similar to the light emitting device 200 described with reference to FIG. 6A, FIG. 6B, and FIG. 6C, except that insulation layers 127, 137, and 147 are interposed between reflection layers 179a, 179b, and 179c and first to third LED stacks 121, 131, and 141.

As the first to third LED stacks 121, 131, and 141, the insulation layers 127, 137, and 147, and the reflection layers 179a, 179b, and 179c are sequentially disposed, an omnidirectional reflector may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
a first LED stack;
a second LED stack disposed on the first LED stack;
a third LED stack disposed on the second LED stack; and
a common electrode electrically connected to a first conductivity type semiconductor layer of each of the first, second, and third LED stacks,
wherein the common electrode includes a step in at least one of the first, second and third LED stacks.

2. The light emitting device of claim 1, wherein the first, second, and third LED stacks are configured to emit light of different wavelengths from one another.

3. The light emitting device of claim 2, wherein the first, second, and third LED stacks are configured to emit blue light, green light, and red light, respectively.

4. The light emitting device of claim 1, wherein:
the first LED stack has a larger effective luminous area than the second and third LED stacks; and
the second LED stack has a larger effective luminous area than the third LED stack.

5. The light emitting device of claim 1, wherein each of the first, second, and third LED stacks has a texture on one surface thereof.

6. The light emitting device of claim 1, further comprising a first connection electrode, a second connection electrode, and a third connection electrode in electrical contact with each second conductivity type semiconductor layer of the first, second, and third LED stacks.

7. The light emitting device of claim 6, wherein each of the first and second connection electrodes has a width gradually decreasing in a direction from the first LED stack to the third LED stack.

8. The light emitting device of claim 6, wherein the first, second, and third connection electrodes have the same minimum width.

9. The light emitting device of claim 1, wherein the common electrode includes a plurality of sub-electrodes coaxially arranged with one another.

10. The light emitting device of claim 1, wherein an outer surface from the first LED stack to the third LED stack is formed along a same line.

11. A light emitting device, comprising:
a first LED stack;
a second LED stack disposed on the first LED stack;
a third LED stack disposed on the second LED stack;
a common electrode electrically connected to a first conductivity type semiconductor layer of each of the first, second, and third LED stacks; and
an insulation layer covering the first, second, and third LED stacks,
wherein:
the second and third LED stacks are recessed inwardly than an outer periphery of the first LED stack; and
a portion of the insulation layer disposed on an upper surface of the first LED stack is exposed around the second LED stack.

12. The light emitting device of claim 11, further comprising material layers disposed on each side surface and each exposed upper surface of the first, second, and third LED stacks,
wherein at least one of the material layers has a different thickness.

13. The light emitting device of claim 11, further comprising a reflection layer disposed on each side surface of the first, second, and third LED stacks.

14. The light emitting device of claim 13, wherein the insulation layer is interposed between each surface of the first, second, and third LED stacks and the reflection layer.

15. The light emitting device of claim 11 wherein each LED stack has a width gradually decreasing from the first LED stack to the third LED stack.

16. The light emitting device of claim 15, wherein:
the first LED stack has a greater width than the second and third LED stacks; and
the second LED stack has a greater width than the third LED stack.

17. The light emitting device of claim 16, wherein:
the first LED stack has a larger effective luminous area than the second and third LED stacks; and
the second LED stack has a larger effective luminous area than the third LED stack.

18. The light emitting device of claim 11, wherein the common electrode passes through at least one of the first, second, and third LED stacks.

19. The light emitting device of claim 18, wherein the common electrode includes a step in at least one of the first, second and third LED stacks.

20. The light emitting device of claim 19, wherein a minimum width of the common electrode is one third of a maximum width thereof.

\* \* \* \* \*